United States Patent [19]
Liu et al.

[11] Patent Number: 6,001,681
[45] Date of Patent: Dec. 14, 1999

[54] METHOD TO REDUCE THE DEPTH OF A BURIED CONTACT TRENCH BY USING A THIN SPLIT POLYSILICON THICKNESS

[75] Inventors: Hsiang Liu; Jing-Chuan Hsieh, both of Hsin-Chu, Taiwan

[73] Assignee: Taiwan Semiconductor Manufacturing Company, Ltd., Hsin-Chu, Taiwan

[21] Appl. No.: 09/234,095

[22] Filed: Jan. 19, 1999

[51] Int. Cl.⁶ .......................... H01L 21/8244; H01L 29/04
[52] U.S. Cl. .......................... 438/238; 438/532; 438/381; 438/586; 438/647; 438/649; 257/344; 257/754; 257/382; 257/385; 257/756
[58] Field of Search ..................... 438/533, 586, 438/684, 238, 524, 657, 232, 226, 532; 257/754, 385, 308, 298, 344, 382, 408

[56] References Cited

U.S. PATENT DOCUMENTS

| | | |
|---|---|---|
| 4,679,171 | 7/1987 | Logwood et al. ...................... 356/154 |
| 5,134,085 | 7/1992 | Gilgen et al. ............................. 437/52 |
| 5,258,096 | 11/1993 | Sandhu et al. .......................... 156/643 |
| 5,494,848 | 2/1996 | Chin ........................................ 438/238 |
| 5,578,873 | 11/1996 | Manning ................................. 257/754 |
| 5,596,215 | 1/1997 | Huaung ................................... 257/344 |
| 5,607,881 | 3/1997 | Huang ..................................... 437/195 |
| 5,668,051 | 9/1997 | Chen et al. ............................. 438/558 |
| 5,721,146 | 2/1998 | Liaw et al. ................................ 437/26 |
| 5,729,055 | 3/1998 | Manning ................................. 257/754 |
| 5,780,331 | 7/1998 | Liaw et al. .............................. 438/238 |

*Primary Examiner*—Charles Bowers
*Assistant Examiner*—Hsien Ming Lee
*Attorney, Agent, or Firm*—George O. Saile; Stephon B. Ackerman; Larry J. Prescott

[57] ABSTRACT

A method of forming buried contacts in MOSFET and CMOS devices which substantially reduces the depth of the buried contact trench. A split polysilicon process is used to form the gate electrode and contact electrode. The first polysilicon layer is very thin layer of undoped polysilicon, having a thickness of less than 100 Angstroms. The second polysilicon layer is a layer of doped polysilicon having a thickness of between about 950 and 1150 Angstroms. The buried contact can be formed either using ion implantation or diffusion of impurities from the layer of doped second polysilicon into the contact region. When the metal layers are etched to form the gate electrode and contact electrode the resulting buried contact trench is less than 500 Angstroms deep.

21 Claims, 5 Drawing Sheets

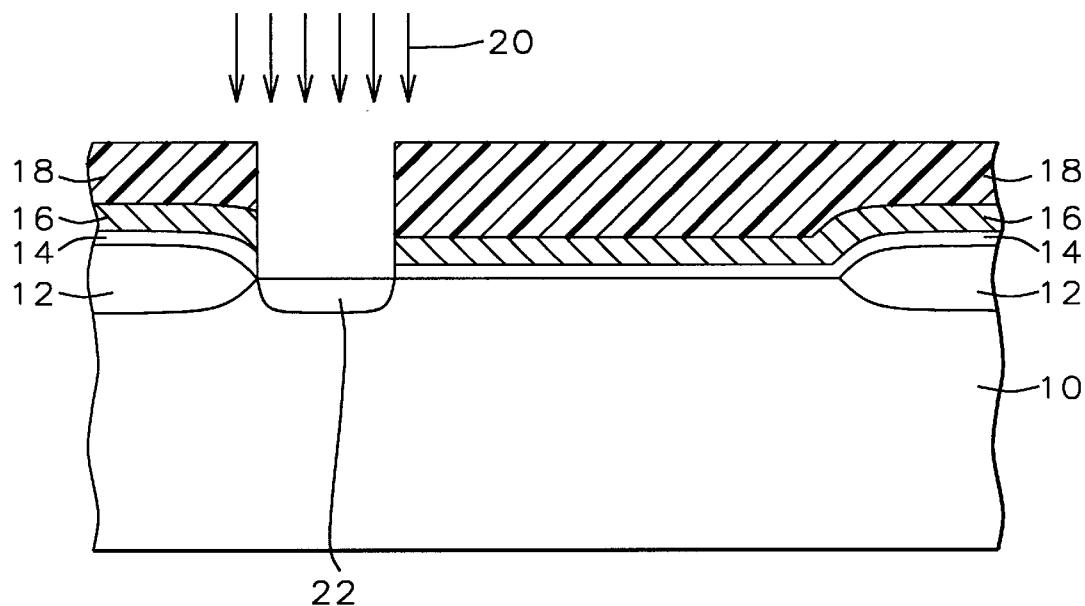
FIG. 1 – Prior Art
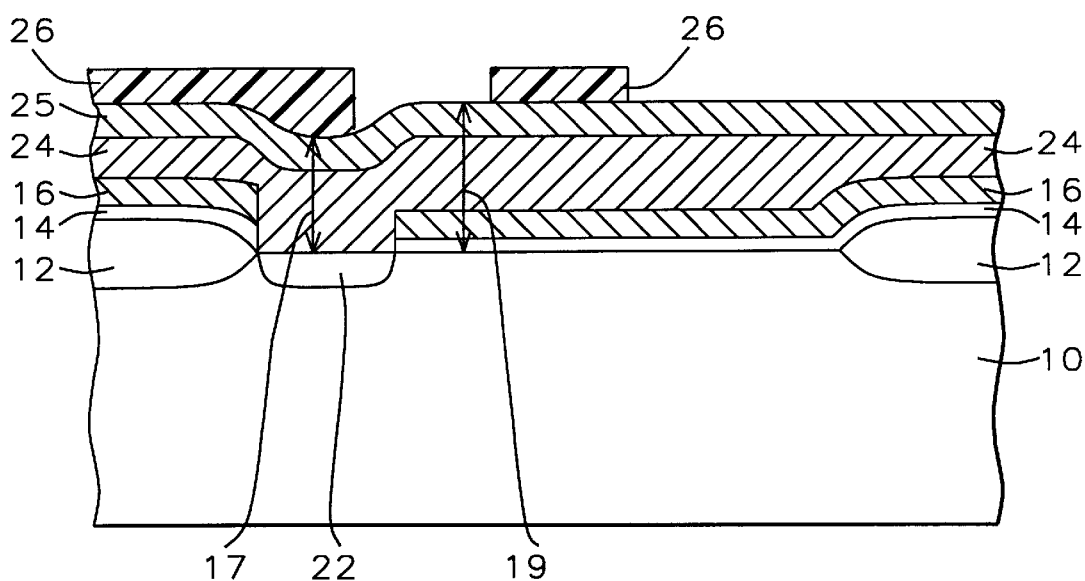
FIG. 2 – Prior Art

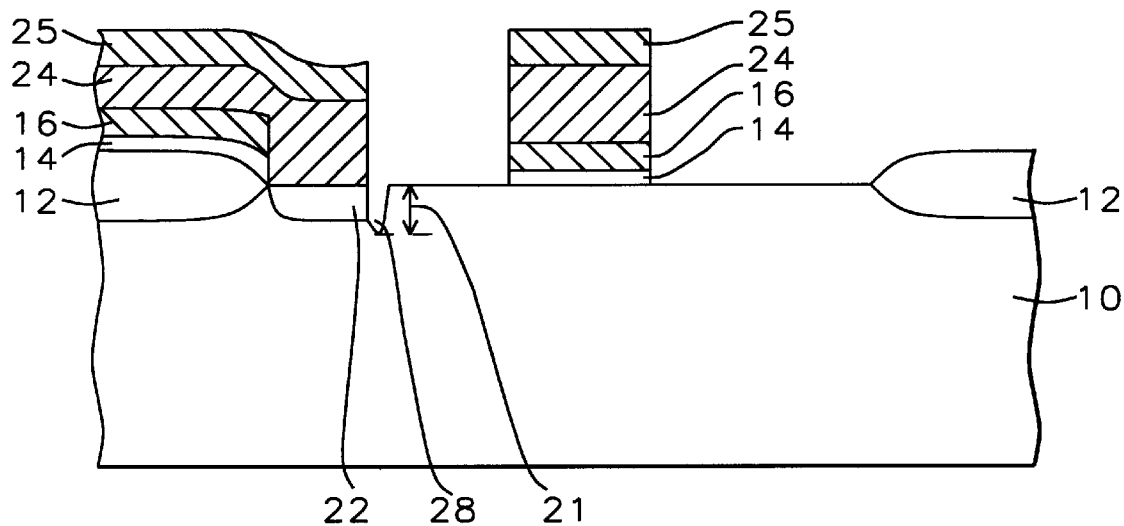
FIG. 3 – Prior Art
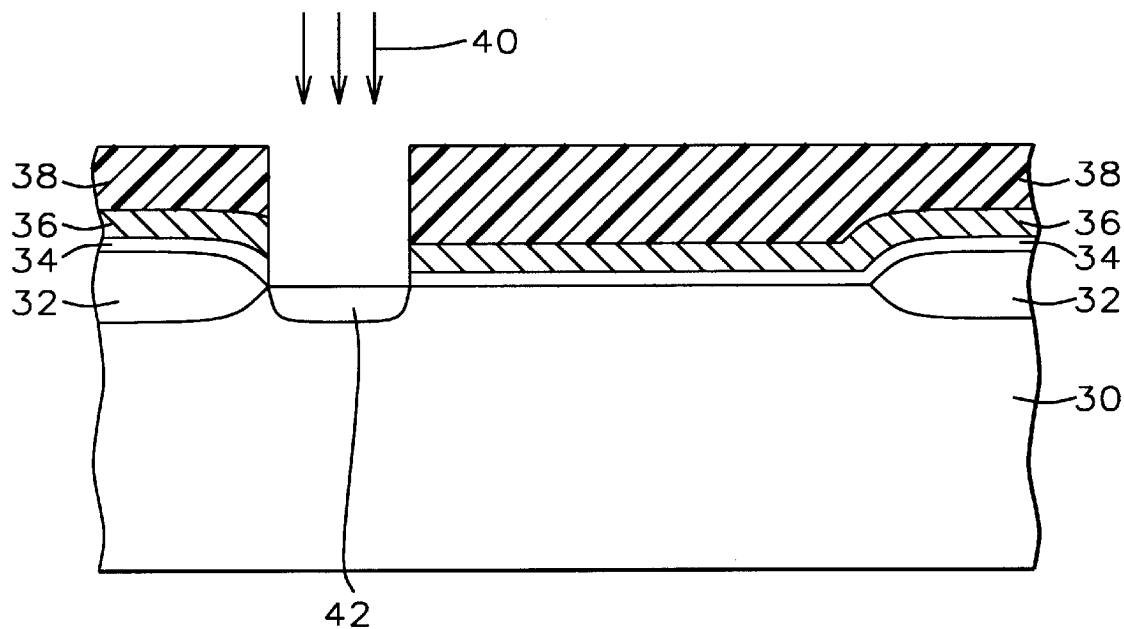
FIG. 4

METHOD TO REDUCE THE DEPTH OF A BURIED CONTACT TRENCH BY USING A THIN SPLIT POLYSILICON THICKNESS

BACKGROUND OF THE INVENTION (1) Field of the Invention

This invention relates to methods of forming buried contacts in MOSFET and CMOS devices and more particularly to methods to reduce the depth of the buried contact trench by using a thin polysilicon layer in a split polysilicon process.

(2) Description of the Related Art

The process of forming buried contacts results in the formation of a buried contact trench. The depth of this trench can become a problem for shallow junction devices. This invention describes a method of reducing the depth of this trench using a split polysilicon process.

U.S. Pat. No. 5,607,881 to Huang describes a method of forming buried contact junctions using over etching of a polysilicon layer to form a buried contact trench. An extra implant is implanted into the substrate around the trench. The buried contact connects to the source/drain regions through the extra implant around the trench.

U.S. Pat. No. 5,668,051 to Chen et al. describes a method of forming buried contacts having reduced series resistance. The buried contact trench is filled with doped polysilicon which reduces the series resistance between the buried contact and the source/drain regions.

U.S. Pat. No. 5,721,146 to Liaw et al. describes a method of forming a buried contact within a trench etched into the silicon substrate.

U.S. Pat. No. 5,258,096 to Sandhu et al. describes a method of using local etch stop layers for self aligned dry etching of contact vias with varying depths.

U.S. Pat. No. 4,679,171 to Logwood et al. describes a memory cell of four IGFET transistor cells arranged in rows and columns. The memory cells use split polysilicon word lines.

U.S. Pat. No. 5,134,085 to Gilgen et al. describes a 10–12 mask split polysilicon process for forming dynamic random access memories.

U.S. Pat. No. 5,578,873 to Manning describes a split polysilicon method for forming a contact electrode which connects to a buried contact region, but does not describe methods to reduce the depth of the buried contact trench.

SUMMARY OF THE INVENTION

Buried contacts are frequently used in metal oxide semiconductor field effect transistors to reduce the resistance between source or drain electrodes and the source or drain regions in the transistor. The etching of polysilicon electrodes making contact to the buried contact results in the formation of a buried contact trench at the edge of the buried contact region. This buried contact trench is between the buried contact and the source/drain region and can increase the series resistance between the buried contact and the source/drain region. This increase in series resistance becomes more serious for shallow junction devices.

FIGS. 1–3 show a conventional method of forming buried contacts. This method uses a split polysilicon process which will be described below. FIG. 1 shows a cross section of a segment of a silicon integrated circuit wafer 10 having field oxide isolation regions 12 formed therein. A layer of gate oxide 14 is formed on the silicon wafer 10 and a layer of undoped first polysilicon 16 is formed on the layer of gate oxide 14. A patterned layer of first photoresist 18 is then formed on the layer of first polysilicon 16. The patterned layer of first photoresist 18 has a hole formed directly over the region of the silicon wafer 10 where the buried contact will be formed. The parts of the layer of first polysilicon 16 and layer of gate oxide 14 not covered by the patterned layer of first photoresist 18 are then etched away using dry anisotropic etching. An ion implantation beam 20 is then used to implant impurities into the silicon wafer 10 forming the buried contact 22. The implanted impurities will be chosen to provide an $N^+$ buried contact region for an N channel device and a $P^+$ buried contact region for a P channel device.

As shown in FIG. 2, the patterned layer of first photoresist is stripped and a layer of doped second polysilicon 24 is then formed on the patterned layer of first polysilicon 16. In the conventional split polysilicon process the layer of first polysilicon and the layer of second polysilicon have about the same thickness, in this example about 550 Angstroms for each layer. A layer of metal silicide 25, having a thickness of about 1000 Angstroms, is then formed on the layer of second polysilicon 24. The thickness 17 of the metal layers over the buried contact 22, the second polysilicon 24 and the metal silicide 25, is about 1550 Angstroms. The thickness 19 of the metal and gate oxide layers adjacent to the buried contact is about 2100 Angstroms of metal; the first polysilicon 16, the second polysilicon 24, and the metal silicide 25; and the thickness of the gate oxide, is about 70 Angstroms. A patterned layer of second photoresist 26 is then formed on the layer of metal silicide 25.

As shown in FIG. 3, the gate oxide 14, the first polysilicon 16, the second polysilicon 24, and the metal silicide 25 not covered by the patterned layer of second photoresist 26 is etched away using dry anisotropic etching to form the gate electrode and the contact electrode. The layer of second photoresist 26 is then stripped. This etching also etches a buried contact trench 28 at the edge of the buried contact 22. In the conventional process herein described the buried contact trench 28 will have a depth 21 of about 1000 Angstroms or more. The series resistance added by this depth of the buried contact trench can become a serious problem for shallow junction devices.

It is a principle objective of this invention to provide a method of forming buried contacts using ion beam implantation and a split polysilicon process which reduces the depth of the buried contact trench.

It is another principle objective of this invention to provide a method of forming buried contacts using diffusion and a split polysilicon process which reduces the depth of the buried contact trench.

These objectives are achieved by using a split polysilicon process which uses polysilicon layers of substantially unequal thicknesses. The thickness of the layer of first polysilicon is about 50 Angstroms and the thickness of the layer of second polysilicon is about 1050 Angstroms, resulting in a combined thickness of about 1100 Angstroms as before. This makes the thickness of the metal over the buried contact and the thickness of the metal adjacent to the buried contact very nearly equal. This near equality of metal thickness reduces the depth of the buried contact trench to less than 500 Angstroms.

BRIEF DESCRIPTION OF THE DRAWINGS

FIG. 1 shows a cross section of a segment of an integrated circuit wafer after forming the patterned layer of first photoresist in the conventional method.

FIG. 2 shows a cross section of the segment of the wafer after forming the patterned layer of second photoresist in the conventional method.

FIG. 3 shows a cross section of the segment of the wafer after the gate electrode, the contact electrode, and the buried contact trench have been formed using the conventional method.

FIG. 4 shows a cross section of a segment of an integrated circuit wafer after forming the patterned layer of first photoresist and the buried contact using ion implantation and the method of this invention.

DESCRIPTION OF THE PREFERRED EMBODIMENTS

Figure 5:
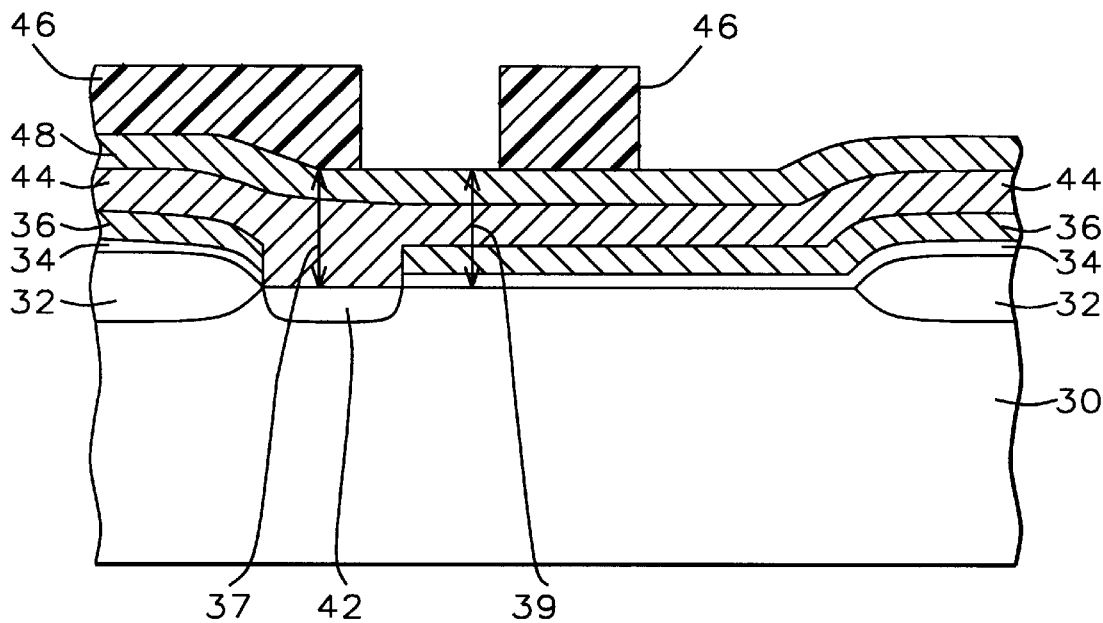
FIG. 5 shows a cross section of the segment of the wafer after forming the patterned layer of second photoresist in the method of this invention.
Figure 6:
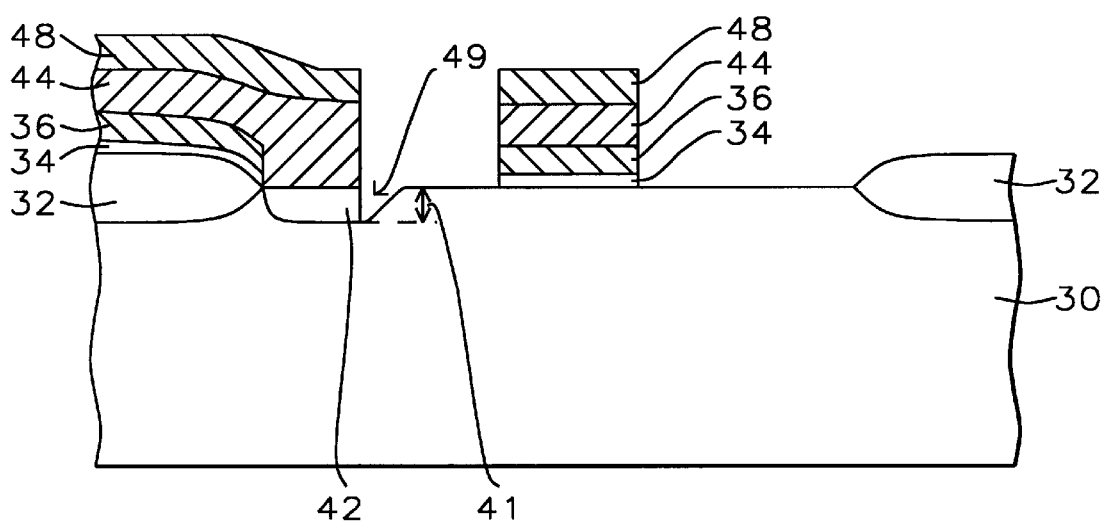
FIG. 6 shows a cross section of the segment of the wafer after the gate electrode, the contact electrode, and the buried contact trench have been formed using the method of this invention.

Refer now to FIGS. 4–6 for a description of the preferred embodiment of the method of forming a buried contact of this invention. FIG. 4 shows a cross section of a segment of a substrate, such as a silicon integrated circuit wafer 30, having field oxide isolation regions 32 formed therein. A layer of gate oxide 34 is formed on the silicon wafer 30 and a layer of undoped thin first polysilicon 36 is formed on the layer of gate oxide 34. The layer of gate oxide, such as silicon oxide, has a thickness of between about 55 and 85 Angstroms. The thickness of the layer of undoped thin first polysilicon 36 is key to the method of this invention and is less than 100 Angstroms, preferably between about 40 and 60 Angstroms. The layer of thin first polysilicon is deposited using a method such as low pressure chemical vapor deposition. A patterned layer of first photoresist 38 is then formed on the layer of first polysilicon 36. The patterned layer of first photoresist 38 has a hole formed directly over the region of the silicon wafer 30 where the buried contact will be formed. The parts of the layer of first polysilicon 36 and layer of gate oxide 34 not covered by the patterned layer of first photoresist 38 are then etched away using dry anisotropic etching. An ion implantation beam 40 is then used to implant impurities into the silicon wafer 30 forming the buried contact 42.

For the case of an N channel MOSFET device the implanted impurities will be chosen to provide an $N^+$ buried contact. In this case the ion implantation will use impurities such as arsenic or $P_{31}$ ions. For the case of a P channel MOSFET device the impurities will be chosen to provide a $P^+$ buried contact. For this case the ion implantation will use impurities such as boron or $BF_2$ ions. In a similar manner CMOS devices could be formed by forming N channel devices with $N^+$ buried contacts and P channel devices with $P^+$ buried contacts in the same substrate.

As shown in FIG. 5, the patterned layer of first photoresist is then stripped and a second layer of polysilicon 44 is then formed on the patterned layer of first polysilicon 36. The layer of second polysilicon 44 is doped to improve conductivity and is deposited using a method such as low pressure chemical vapor deposition. The layer of second polysilicon may be deposited as doped polysilicon or may be doped in situ. The layer of second polysilicon has a thickness of between about 950 and 1150 Angstroms. A layer of metal silicide 48 such as titanium silicide, cobalt silicide, or tungsten silicide, having a thickness of between about 900 and 1100 Angstroms, is then formed on the layer of second polysilicon 44. The thickness 37 of the metal and polysilicon layers over the buried contact 42, the second polysilicon 44 and the metal silicide 48, is between about 1850 and 2250 Angstroms. The thickness 39 of the metal, polysilicon, and gate oxide layers adjacent to the buried contact is between about 1890 and 2310 Angstroms of first polysilicon 36, second polysilicon 44, and metal silicide 48; and between about 55 and 85 Angstroms of gate oxide 34. A patterned layer of second photoresist 46 is then formed on the layer of metal silicide 48.

As shown in FIG. 6, the gate oxide 34, the first polysilicon 36, the second polysilicon 44, and the metal silicide 48 not covered by the patterned layer of second photoresist 46 is etched away using dry anisotropic etching to form the gate electrode and the contact electrode and the layer of second photoresist 46 is stripped. This etching also etches a buried contact trench 49 at the edge of the buried contact 42. Since the thickness of the metal and polysilicon over the buried contact is nearly equal to the thickness of the metal and polysilicon adjacent to the buried contact the depth 41 of the buried contact trench 49 is held to 500 Angstroms or less. The series resistance added by the depth of the buried contact trench will not be a problem for shallow junction devices.

Figure 7:
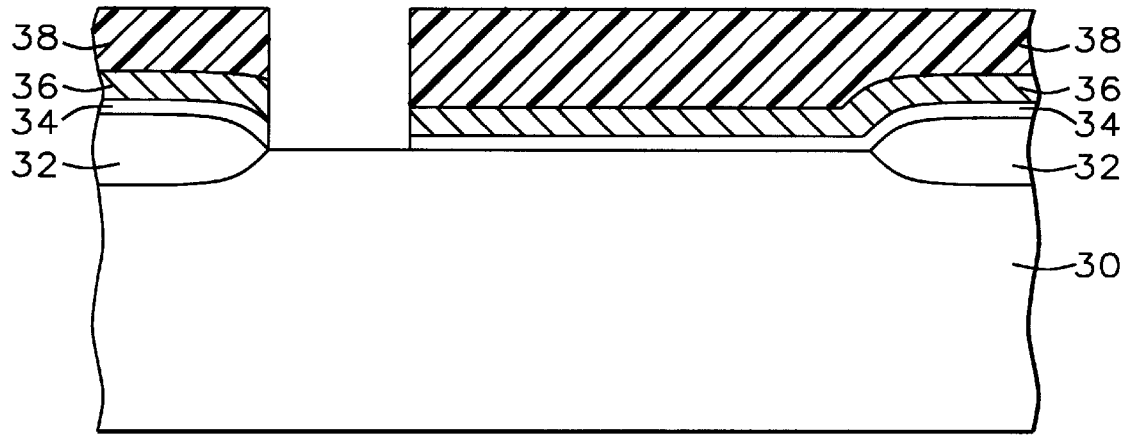
FIG. 7 shows a cross section of a segment of an integrated circuit wafer after forming the patterned layer of first photoresist using the method of this invention.

Refer now to FIGS. 7–10 for a description of another embodiment of the method of forming a buried contact of this invention. FIG. 7 shows a cross section of a segment of a substrate, such as a silicon integrated circuit wafer 30, having field oxide isolation regions 32 formed therein. A layer of gate oxide 34 is formed on the silicon wafer 30 and a layer of undoped thin first polysilicon 36 is formed on the layer of gate oxide 34. The layer of gate oxide, such as silicon oxide, has a thickness of between about 55 and 85 Angstroms. As in the preceding embodiment, the thickness of the undoped layer of thin first polysilicon 36 is key to the method of this invention and is less than 100 Angstroms, preferably between about 40 and 60 Angstroms. The layer of thin first polysilicon is deposited using a method such as low pressure chemical vapor deposition. A patterned layer of first photoresist 38 is then formed on the layer of first polysilicon 36. The patterned layer of first photoresist 38 has a hole formed directly over the region of the silicon wafer 30 where the buried contact will be formed. The parts of the layer of first polysilicon 36 and layer of gate oxide 34 not covered by the patterned layer of first photoresist 38 are then etched away using dry anisotropic etching.

Figure 8:
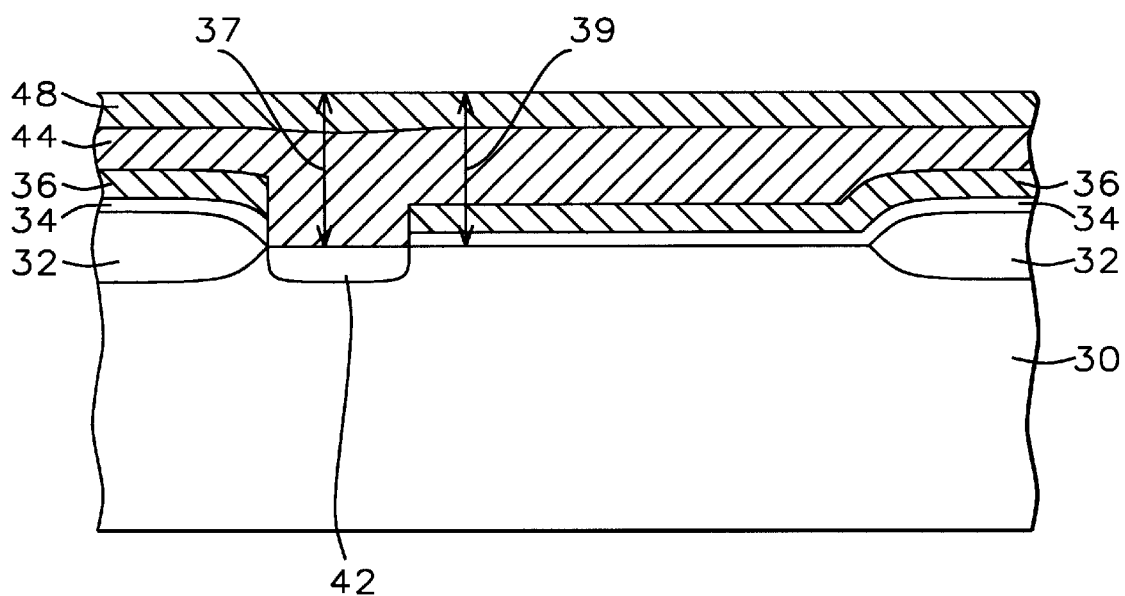
FIG. 8 shows a cross section of the segment of the wafer after forming the layer of doped second polysilicon, the layer of metal silicide, and the diffused buried contact using the method of this invention.

Next, as shown in FIG. 8, the patterned layer of first photoresist is then stripped and a second layer of polysilicon 44 is then formed on the patterned layer of first polysilicon 36. The layer of second polysilicon 44 is doped either as deposited or in situ to improve conductivity and is deposited using a method such as low pressure chemical vapor deposition. The layer of second polysilicon has a thickness of between about 950 and 1150 Angstroms. A layer of metal silicide 48 such as titanium silicide, cobalt silicide, or tungsten silicide having a thickness of between about 900 and 1100 Angstroms is then formed on the layer of second polysilicon 44.

The layer of doped second polysilicon will be doped with N type impurities, such as arsenic or phosphorous, for N channel MOSFET devices or with P type impurities, such as boron, for P channel MOSFET devices. During subsequent heat treatments, such as annealing of the second layer of polysilicon at a temperature of between about 500° C. and 650° C., the impurities will diffuse from the doped polysilicon into that part of the silicon substrate 30 in direct contact with the layer of doped second polysilicon 44 forming a buried contact 42, see FIG. 8. For the case of an N channel MOSFET device the implanted impurities will be chosen to provide an $N^+$ buried contact. For the case of a P channel MOSFET device the impurities will be chosen to provide a $P^+$ buried contact. In a similar manner CMOS devices could be formed by forming N channel devices with $N^+$ buried contacts and P channel devices with $P^+$ buried contacts in the same substrate.

Figure 9:
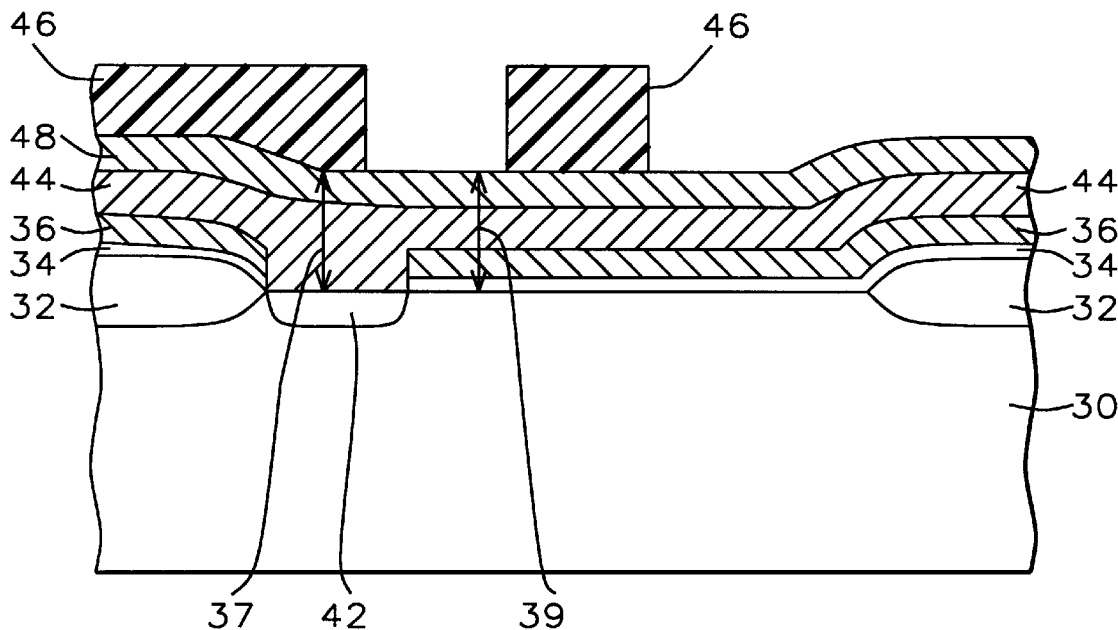
FIG. 9 shows a cross section of the segment of the wafer after forming the patterned layer of second photoresist in the method of this invention.

Again referring to FIG. 8, the thickness 37 of the metal and polysilicon layers over the buried contact 42, the second polysilicon 44 and the metal silicide 48, is between about 1850 and 2250 Angstroms. The thickness 39 of the metal, polysilicon, and gate oxide layers adjacent to the buried contact is between about 1890 and 2310 Angstroms of first polysilicon 36, second polysilicon 44, and metal silicide 48; and between about 55 and 85 Angstroms of gate oxide 34. As shown in FIG. 9, a patterned layer of second photoresist 46 is then formed on the layer of metal silicide 48.

Figure 10:
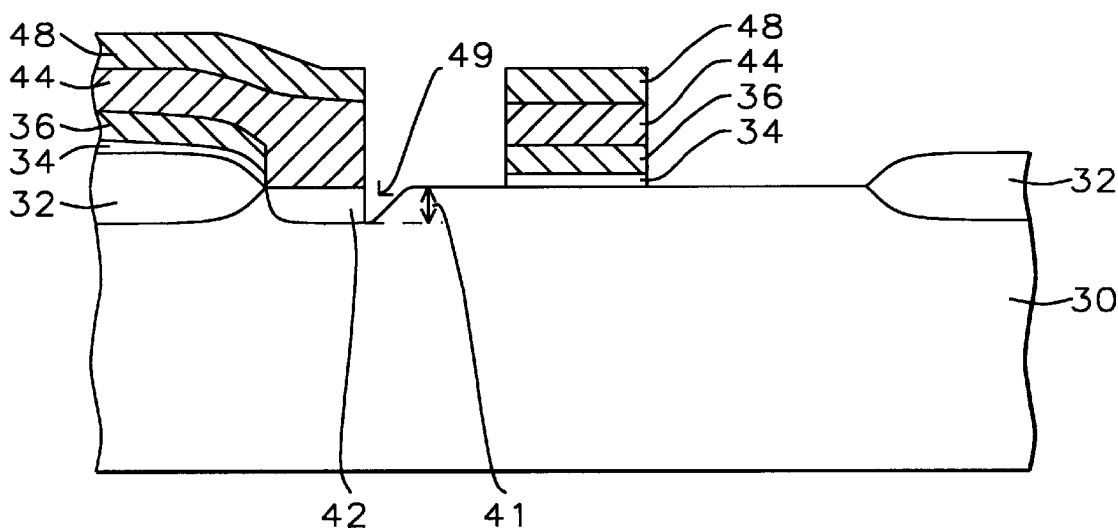
FIG. 10 shows a cross section of the segment of the wafer after the gate electrode, the contact electrode, and the buried contact trench have been formed using the method of this invention.

Next, as shown in FIG. 10, the gate oxide 34, the first polysilicon 36, the second polysilicon 44, and the metal silicide 48 not covered by the patterned layer of second photoresist 46 is etched away using dry anisotropic etching to form the gate electrode and the contact electrode and the layer of second photoresist 46 is stripped, as in the preceding embodiment. This etching also etches a buried contact trench 49 at the edge of the buried contact 42. Since the thickness of the metal and polysilicon over the buried contact is nearly equal to the thickness of the metal and polysilicon adjacent to the buried contact the depth 41 of the buried contact trench 49 is held to 500 Angstroms or less. The series resistance added by the depth of the buried contact trench will not be a problem for shallow junction devices.

While the invention has been particularly shown and described with reference to the preferred embodiments thereof, it will be understood by those skilled in the art that various changes in form and details may be made without departing from the spirit and scope of the invention.

What is claimed is:

1. A method of forming a buried contact trench, comprising the steps of:
   providing a substrate having a buried contact region;
   depositing a layer of gate oxide on said substrate;
   depositing a layer of thin first polysilicon on said layer of gate oxide, wherein the thickness of said layer of thin polysilicon is 100 Angstroms or less;
   forming a patterned layer of first photoresist on said layer of thin first polysilicon, wherein said patterned layer of first photoresist has an opening over said buried contact region;
   etching away those parts of said layer of thin first polysilicon and said layer of gate oxide over said buried contact region using said patterned layer of first photoresist as a mask, thereby forming a patterned layer of thin first polysilicon and a patterned layer of gate oxide;
   forming a buried contact in said buried contact region using ion implantation;
   stripping said patterned layer of first photoresist;
   depositing a layer of second polysilicon on said patterned layer of thin first polysilicon and said buried contact region;
   forming a layer of metal silicide on said layer of second polysilicon;
   forming a patterned layer of second photoresist on said layer of metal silicide;
   etching away those parts of said layer of metal silicide, said layer of second polysilicon, said patterned layer of thin first polysilicon, and said patterned layer of gate oxide not covered by said patterned layer of second photoresist using said patterned layer of second photoresist as a mask thereby forming a gate electrode, a contact electrode, and a buried contact trench wherein said buried contact trench has a trench depth and is in said buried contact region; and
   stripping said patterned layer of second photoresist.

2. The method of claim 1 wherein the thickness of said layer of thin first polysilicon is between about 40 and 60 Angstroms.

3. The method of claim 1 wherein the thickness of said layer of second polysilicon is between about 950 and 1150 Angstroms.

4. The method of claim 1 wherein the thickness of said layer of metal silicide is between about 900 and 1100 Angstroms.

5. The method of claim 1 wherein said metal silicide is tungsten silicide.

6. The method of claim 1 wherein said metal silicide is titanium silicide or cobalt silicide.

7. The method if claim 1 wherein said trench depth is about 500 Angstroms or less.

8. The method of claim 1 wherein said layer of gate oxide is silicon oxide having a thickness of between about 55 and 85 Angstroms.

9. The method of claim 1 wherein said ion implantation uses arsenic or $P_{31}$ ions.

10. The method of claim 1 wherein said ion implantation uses boron or $BF_2$ ions.

11. A method of forming a buried contact trench, comprising the steps of:
    providing a substrate having a buried contact region;
    depositing a layer of gate oxide on said substrate;
    depositing a layer of thin first polysilicon on said layer of gate oxide, wherein the thickness of said layer of thin polysilicon is 100 Angstroms or less;
    forming a patterned layer of first photoresist on said layer of thin first polysilicon, wherein said patterned layer of first photoresist has an opening over said buried contact region;
    etching away those parts of said layer of thin first polysilicon and said layer of gate oxide over said buried contact region using said patterned layer of first photoresist as a mask, thereby forming a patterned layer of thin first polysilicon and a patterned layer of gate oxide;
    stripping said patterned layer of first photoresist;
    depositing a layer of second polysilicon on said patterned layer of thin first polysilicon and said buried contact region wherein said layer of second polysilicon is doped with impurities;

annealing said layer of second polysilicon thereby diffusing said impurities into said buried contact region forming a buried contact;

forming a layer of metal silicide on said layer of second polysilicon;

forming a patterned layer of second photoresist on said layer of metal silicide;

etching away those parts of said layer of metal silicide, said layer of second polysilicon, said patterned layer of thin first polysilicon, and said patterned layer of gate oxide not covered by said patterned layer of second photoresist using said patterned layer of second photoresist as a mask thereby forming a gate electrode, a contact electrode, and a buried contact trench wherein said buried contact trench has a trench depth and is in said buried contact region; and stripping said patterned layer of second photoresist.

12. The method of claim 11 wherein the thickness of said layer of thin first polysilicon is between about 40 and 60 Angstroms.

13. The method of claim 11 wherein the thickness of said layer of second polysilicon is between about 950 and 1150 Angstroms.

14. The method of claim 11 wherein the thickness of said layer of metal silicide is between about 900 and 1100 Angstroms.

15. The method of claim 11 wherein said metal silicide is tungsten silicide.

16. The method of claim 11 wherein said metal silicide is titanium silicide or cobalt silicide.

17. The method if claim 11 wherein said trench depth is about 500 Angstroms or less.

18. The method of claim 11 wherein said layer of gate oxide is silicon oxide having a thickness of between about 55 and 85 Angstroms.

19. The method of claim 11 wherein said impurities are arsenic or phosphorous.

20. The method of claim 11 wherein said impurities are boron.

21. The method of claim 11 wherein said annealing said layer of second polysilicon uses a temperature of between about 500° C. and 650° C.

* * * * *